United States Patent [19]

Berg

[11] Patent Number: 4,895,520

[45] Date of Patent: Jan. 23, 1990

[54] METHOD OF FABRICATING A SUBMICRON SILICON GATE MOSFETG21 WHICH HAS A SELF-ALIGNED THRESHOLD IMPLANT

[75] Inventor: John E. Berg, New York, N.Y.

[73] Assignee: Standard Microsystems Corporation, Hauppauge, N.Y.

[21] Appl. No.: 305,959

[22] Filed: Feb. 2, 1989

[51] Int. Cl.[4] .................. H01L 21/265; H01L 21/283; H01L 21/316

[52] U.S. Cl. .......................... 437/45; 437/41; 437/44; 437/203; 437/29; 437/984; 148/DIG. 141

[58] Field of Search ........................ 437/41, 42, 45, 43, 437/203, 28, 29, 44, 984; 357/23.12, 23.1, 23.3, 23.8; 156/653, 657, 662; 148/DIG. 26, DIG. 141

[56] References Cited

U.S. PATENT DOCUMENTS

| | | | |
|---|---|---|---|
| 3,481,030 | 12/1969 | Te Velde et al. | 437/22 |
| 3,558,366 | 1/1971 | Lepselter | 437/40 |
| 4,033,026 | 7/1977 | Pashley | 437/41 |
| 4,212,683 | 7/1980 | Jones et al. | 357/23.12 |
| 4,334,348 | 6/1982 | Trenary et al. | 156/662 |
| 4,358,340 | 11/1982 | Fu | 150/653 |
| 4,359,816 | 11/1982 | Abbas et al. | 437/44 |
| 4,471,522 | 9/1984 | Jambotkar | 156/653 |
| 4,514,893 | 5/1985 | Kinsbron et al. | 437/35 |
| 4,536,782 | 8/1985 | Brown | 357/23.1 |
| 4,599,790 | 7/1986 | Kim et al. | 437/187 |
| 4,685,196 | 8/1987 | Lee | 437/41 |
| 4,737,828 | 4/1988 | Brown | 437/41 |

FOREIGN PATENT DOCUMENTS 0051840  5/1981  Japan ........................ 437/29

Primary Examiner—Olik Chaudhuri
Assistant Examiner—T. N. Quach
Attorney, Agent, or Firm—Hopgood, Calimafde, Kalil, Blaustein & Judlowe

[57] ABSTRACT

A method is disclosed for fabricating submicron silicon gate metal-oxide-semiconductor field effect transistors (MOSFETs) which have threshold and punchthrough implants that are self-aligned to the gate electrode and source and drain regions. A layer of dielectric material (12) is either deposited or grown on the surface of a substrate, and a trench (15), which defines the region of the MOSFET gate electrode, is formed in the dielectric layer. A gate oxide (16) is formed at the exposed substrate at the bottom of the trench, and an implant is performed into the silicon substrate wherever there is gate oxide, but not into the portion of the substrate covered by the original dielectric layer. A layer of polysilicon (20), preferably doped, or another metallic film is then deposited onto the surface. The polysilicon is etched back to the top surface of the dielectric layer, thereby leaving polysilicon in the trench to form the gate electrode (24). The dielectric layer (12) is then etched back preferentially to a thickness approximately equal to the thickness of the gate dielectric, and a high-dose implant is performed through the reduced thickness dielectric layer into the silicon substrate, except for the areas covered by the polysilicon gate to form the source and drain regions (30) of the MOSFET.

14 Claims, 1 Drawing Sheet

_4,895,520_

METHOD OF FABRICATING A SUBMICRON SILICON GATE MOSFETG21 WHICH HAS A SELF-ALIGNED THRESHOLD IMPLANT

BACKGROUND OF THE INVENTION

The present invention relates generally to the fabrication of semiconductor circuits, and more particularly to the fabrication of very large-scale integrated (VLSI) circuits.

Recent developments in processes for fabricating MOS VLSI integrated circuits have resulted in MOS devices that are capable of operating at higher speeds with smaller geometries. As the devices continue to shrink in size, it becomes increasingly difficult to achieve the desired low junction capacitance, acceptable device punchthrough voltages, and acceptable junction avalanche breakdowns in devices fabricated by the current bulk silicon MOSFET processes. Part of the reason for this lies in the present practice of using blanket threshold and/or channel stop implants which are simultaneously implanted beneath the MOSFET channel regions and at or immediately beneath the metallurgical junctions of the MOSFET source-drain regions. While this practice provides generally adequate results at device channel lengths of one micron or greater, smaller devices having submicron channel lengths exhibit high junction floor capacitance and lower diode avalanche breakdowns, as well as reduced transistor punchthrough characteristics.

There is thus a need for an improved method of fabricating submicron VLSI circuits in which these last-mentioned effects are minimized. This is achieved in the present invention by self-aligning the threshold and punchthrough implants underneath the gate electrode, such that the MOSFET's gate electrode and the diffused, high-dose source and drain regions do not receive these implants.

SUMMARY OF THE INVENTION

If is an object of the present invention to provide a process in which the floor capacitance of the source and drain junctions of the MOSFET is minimized.

It is another object of the present invention to provide a process in which the avalanche breakdown characteristics of the source and drain junctions are improved.

It is yet a further object of the present invention to provide a process of the type described which does not require the use of an additional lithography step.

To these ends the present invention provides a process for fabricating submicron silicon gate metal-oxide-semiconductor field effect transistors (MOSFETs) which have threshold and punchthrough implants that are self-aligned to the gate electrode and source and drain regions. A layer of dielectric material is either deposited or grown on the surface of a substrate, and a trench, which defines the region of the MOSFET gate electrode, is formed in the dielectric layer. A gate oxide is formed at the exposed substrate at the bottom of the trench, and an implant is performed into the silicon substrate wherever there is gate oxide, but not into the portion of the substrate covered by the original dielectric layer. A layer of polysilicon, preferably doped, or another metallic film is then deposited onto the surface. The polysilicon is etched back to the top surface of the dielectric layer, thereby leaving polysilicon in the trench to form the gate electrode. The original dielectric layer is then etched back preferentially to a thickness approximately equal to the thickness of the gate dielectric, and a high-dose implant is performed through the reduced thickness dielectric layer into the silicon substrate, except for the areas covered by the polysilicon gate to form the source and drain regions of the MOSFET.

BRIEF DESCRIPTION OF THE DRAWINGS

To the accomplishment of the above and to such other objects as may hereinafter appear, the present invention is directed to a process for fabricating a VLSI MOS device substantially as defined in the appended claims and as described in the following specification, as considered with the accompanying drawings in which:

DESCRIPTION OF THE PREFERRED EMBODIMENT

Figure 1:
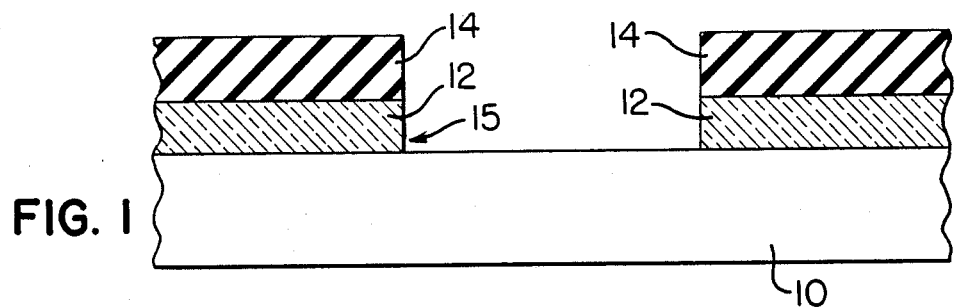
FIGS. 1–5 are cross-sectional views of a MOSFET shown during various steps of its fabrication in accordance with the process of this invention, FIG. 5 illustrating the completed MOSFET structure prior to metallization.

As shown in FIG. 1, in the process of the invention, a dielectric layer 12, such as silicon dioxide, of between 1500Å and 5000Å is either deposited or grown on a silicon substrate 10, which may be either p-type for an n-channel MOSFET or n-type for a p-channel MOSFET. Alternatively, dielectric layer 12 may consist of silicon nitride, silicon oxynitride, or aluminum oxide. The effective doping concentration of the substrate may range from $2 \times 10^{10}$ to $9 \times 10^{17}$ ions per cubic centimeter at 300 degrees Kelvin. A layer of resist material 14 is deposited over dielectric layer 12. Thereafter, by means of a conventional lithography step, a pattern is defined in resist material 14. As shown in FIG. 1, a preferential anisotropic etch operation, which may, for example, be either a wet chemical etch or preferably a plasma etch, is used to form a trench 15 in the dielectric layer 12, which has a width between 500Å and 5000Å. Thereafter, a conventional ashing or wet chemical technique is used to remove the remaining resist layer 14.

Figure 2:
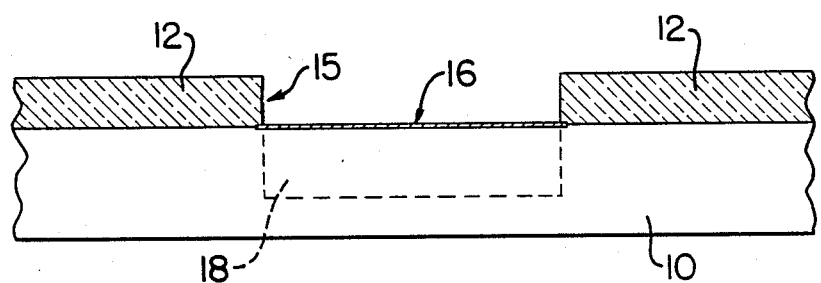

Thereafter, as shown in FIG. 2, the substrate 10 is placed in an oxidizing environment at a high temperature to form a thin oxide layer 16, which will later be used as the gate oxide of the MOSFET. The thickness of oxide layer 16 may be 40Å to 250Å. A threshold adjust and/or a punchthrough implant is then performed to create a threshold implant region 18 in the exposed upper portion of the substrate.

The projected range plus 4 straggle limit of the threshold and/or punchthrough implants should not exceed the thickness of dielectric layer 12. For example, if the thickness of dielectric layer 12 is 1500Å, the energy of a boron 11 implant should not exceed about 18keV; if the dielectric layer 12 has a thickness of 4500Å, the energy of the boron 11 implant should not exceed 70keV. Upon completion of the threshold-/punchthrough implant, which is likely to be p-type for an n-channel transistor and either n-type or p-type for a p-channel transistor, an optional high-temperature implant activation step may be performed.

Figure 3:
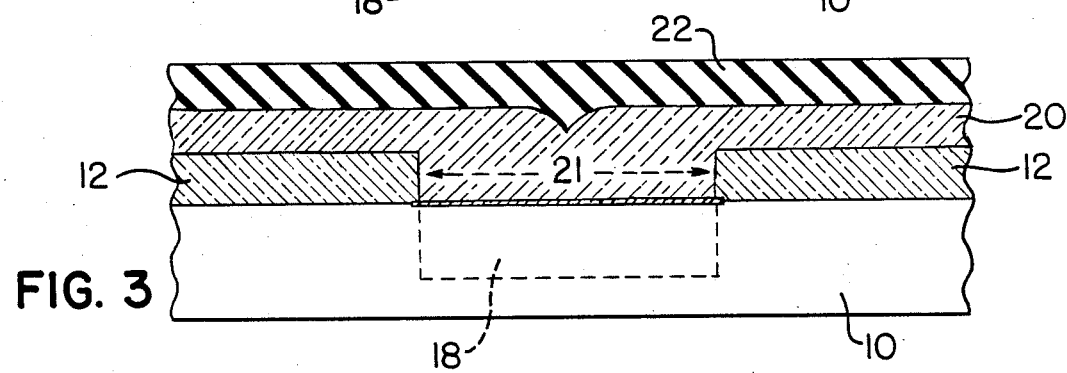

A low-pressure chemically vapor-deposited polysilicon layer 20, as shown in FIG. 3, is then deposited over the dielectric layer 12 and into the trench 15. If desired, an aluminum layer or layer of another refractory metal, such as tungsten, may be employed in place of the polysilicon in layer 20. Layer 20, which may be doped n+ for n-channel devices and either n+ or p+ for p-channel devices, should have an as-deposited thickness which is at least one-half the width 21 of the trench 15 and preferably not greater than 1 um. Upon completion of the doped polysilicon deposition, a resist layer 22 is spun on the silicon substrate and over the polysilicon layer 20, and is flowed at a temperature of approximately 200° C. across the surface in order to make the surface planar. A plasma etchback is then performed by etching the resist layer 22 and polysilicon layer 20 in a fluorocarbon and oxygen plasma chemistry which provides a 1:1 selectivity.

Figure 4:
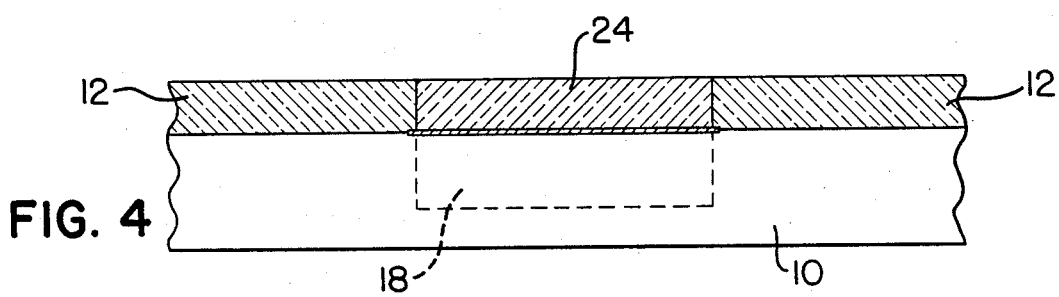
Figure 5:
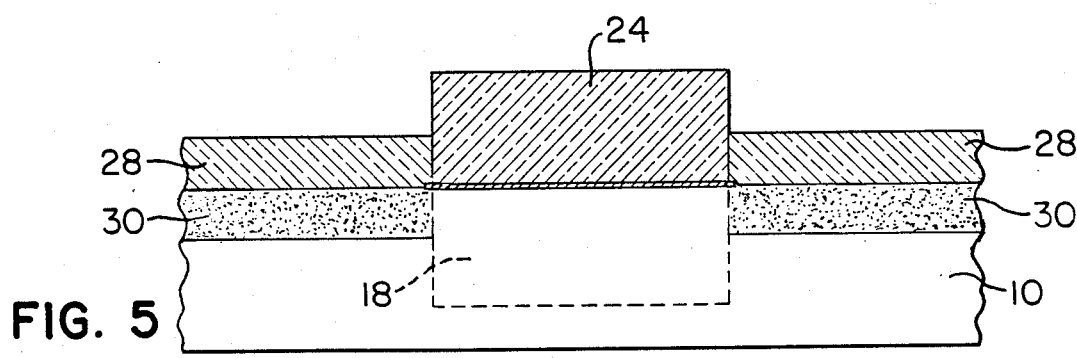

The plasma etchback step is halted when the top surface of dielectric layer 12 is reached, thereby leaving a polysilicon electrode 24 in the trench, as shown in FIG. 4. A preferential plasma or wet chemical etch, such as with hydrofluoric acid, is then performed to remove either all or most all of dielectric layer 12. This etch, however, does not remove the gate electrode layer 24, as shown in FIG. 5, and may, as shown in FIG. 5, leave a residual, thin dielectric layer 28 over the other portions of the substrate. Subsequent to this etch, a high-dose implant, preferably between $1 \times 10^{13}$ and $1 \times 10^{16}$ ions per cm$^2$ is performed through the residual, thin dielectric layer 28 to define the source and drain regions 30 of the MOS transistor. The implant energy is also dictated by the range statistics such that the dopant atoms are stopped by the gate electrode 24 and do not enter into the underlying channel area. This implant, which implants n-type dopant for n-channel MOSFETs and p-type dopant for p-channel MOSFETs, may be annealed at a high temperature for a short period of time and a subsequent dielectric and metallization layer or layers may be deposited and lithographically defined in order to make isolation and connection to other circuitry.

As shown in FIG. 5, in a MOSFET fabricated in accordance with the process of this invention, the channel and punchthrough implant 18 is self-aligned to the MOSFET polysilicon gate electrode 24, as is the source/drain implant. As a consequence of this configuration, the edges of the channel/punchthrough implant and those of the source/drain implant are aligned with respect to each other. Moreover, the source and drain implant depth is less than or equal to the punchthrough and threshold adjust implant depths and the final surface concentration of the silicon substrate underneath the silicon gate region is less than or equal to the final surface concentration of the silicon substrate which receives the source and drain high-dose implant. In addition, the final surface concentration of the silicon substrate underneath the gate electrode is greater than or equal to the initial silicon substrate doping concentration.

It will be appreciated from the foregoing description of a preferred embodiment of the invention, that the process of the invention substantially minimizes the need to compromise certain MOS active device characteristics, namely the junction floor capacitance, the avalanche breakdown of the junction, and the transistor punchthrough characteristics. This is achieved by self-aligning the threshold and punchthrough implants to both the gate electrode and the source and drain regions. This self-aligned process allows MOSFET channel lengths to be scaled to smaller dimensions than can be achieved by current practices. It will also be appreciated that modifications may be made to the embodiment of the invention hereinabove described without necessarily departing from the spirit and scope of the invention.

What is claimed is:

1. A process for fabricating an integrated circuit comprising the steps of providing a silicon substrate, forming an insulating layer on said substrate, forming at least one trench in said insulating layer which extends to the insulating/silicon interface, forming a gate oxide layer at the bottom of said trench on the exposed surface of said substrate, implanting impurities through said gate oxide layer to the upper surface of said substrate but not into regions beneath said remaining portion of said insulating layer, thereby to establish a threshold adjust implant beneath said gate oxide layer, depositing a conductive layer over said insulating layer and into said trench, etching said conductive layer to the top surface of said insulating layer, thereby to form a gate electrode in said trench over said oxide layer and surrounded by said insulating layer, removing at least a portion of said insulating layer without removing said gate electrode, and implanting a dopant into said substrate in areas previously covered by said insulating layer but not in the area underneath said gate electrode, thereby to form source and drain regions, whereby the edges of said threshold adjust implant are aligned with the edges of said source and drain regions and said gate electrode.

2. The process defined of claim 1, in which the thickness of said insulating layer is 1500Å to 5000Å.

3. The process defined of claim 2, in which said insulating layer is one of silicon dioxide, silicon nitride, silicon oxynitride, or aluminum oxide.

4. The process of claim 1, in which the width of said trench is 500Å to 5000Å.

5. The process of claim 1, wherein said gate oxide layer forming step includes the step of oxidizing the surface of said substrate at the bottom of said trench, thereby to form said gate oxide layer of a thickness between 40Å and 250Å.

6. The process of claim 1, further comprising the step of annealing said substrate to activate the implanted impurities.

7. The process of claim 1, in which said conductive layer is a polysilicon film which is n+doped, p+doped, or undoped.

8. The process of claim 1, in which said conductive layer is one of a polysilicon film, an aluminum layer, or a layer of another refractory metal.

9. The process of claim 8, in which the deposited thickness of said conductive layer is between twice the width of said trench and 1 um.

10. The process of claim 1, further comprising the step of depositing a photoresist layer over said conductive layer, and in which said photoresist layer has a thickness of between 1000 um and 15,000 um.

11. The process of claim 1, in which said insulating layer is removed by the use of hydrofluoric acid or a fluorine/oxygen plasma etching.

12. The process of claim 1, in which the source and drain implant depth is less than or equal to the punchthrough and threshold adjust implant depths.

13. The process of claim 12, in which the final surface concentration of the silicon substrate underneath the silicon gate region is less than or equal to the final surface concentration of the silicon substrate which receives the source and drain high dose implant.

14. The process in claim 13, where the final surface concentration of the silicon substrate underneath the gate electrode is greater than or equal to the initial silicon substrate doping concentration.

* * * * *